United States Patent [19]

Turnipseed et al.

[11] Patent Number: 5,275,517
[45] Date of Patent: Jan. 4, 1994

[54] RISTON CUTTING MACHINE

[75] Inventors: Ozerine Turnipseed, 4545 Clinton Ave. S., Minneapolis, Minn. 55409; Robert Kliewer, Bloomington; Steven M. Nolan, Edina, both of Minn.

[73] Assignee: Ozerine Turnipseed, Minneapolis, Minn.

[21] Appl. No.: 935,554

[22] Filed: Aug. 26, 1992

[51] Int. Cl.$^5$ .......................... B23C 3/00; B23B 41/00
[52] U.S. Cl. ........................... 409/184; 144/134 A; 408/16; 409/131
[58] Field of Search .................. 409/97, 131, 132, 184, 409/193, 128, 96; 144/134; 408/16, 1; 29/335

[56] References Cited

U.S. PATENT DOCUMENTS

| | | | |
|---|---|---|---|
| 3,854,836 | 12/1974 | Weissman | 408/136 |
| 4,537,234 | 8/1985 | Onsrud | 409/97 X |
| 4,708,545 | 11/1987 | Fujii et al. | 409/131 |
| 5,036,574 | 8/1991 | Kakimoto | 29/335 |
| 5,118,227 | 6/1992 | Gracia | 408/16 |

FOREIGN PATENT DOCUMENTS

| | | | |
|---|---|---|---|
| 53109 | 3/1984 | Japan | 408/16 |
| 166914 | 7/1987 | Japan | 408/16 |
| 124206 | 5/1990 | Japan | 408/13 |

Primary Examiner—William Briggs
Attorney, Agent, or Firm—James R. Cwayna

[57] ABSTRACT

A tool for removing resist material from the sides of conductive boards such as circuit boards wherein it is necessary to remove resist material which covers and surrounds passages which are provided through the conductive board. The tool includes a surface plate to support the board, a light source below the plate, a vertically shiftable cutting tool arranged below the surface plate and an inspection unit for visual and electronic inspection of the passage location mounted above the surface plate. Light passing from below the surface plate will be visible to the inspection unit as a board passage is located over the center of the cutting tool with the light passing through the supporting surface plate, the resist material and the board passage. When the passage is properly located, a clamp device is actuated to positively clamp the board into proper cutting position for removal of the resist material from the bottom side thereof. Mechanically provided stops limit the upward travel of the cutting tool to prevent penetration into the board material such that only resist material is removed. The board is turned over and the action repeated to now remove resist material from the other side of the board.

10 Claims, 5 Drawing Sheets

RISTON CUTTING MACHINE

RELATED APPLICATIONS

There are no applications in the United States Patent Office currently on file by the inventor which should be considered with regard to the prosecution of this application.

FEDERAL SPONSORSHIP

This invention has not been made under any federally sponsored research and development arrangement nor under any other research and development program.

FIELD OF THE INVENTION

This invention relates to a tool directed to the removal of resist material from the surfaces of conductive boards such as circuit boards where it is necessary to remove resist material which surrounds or covers passages through the board without invasion of the surface of the board.

SUMMARY OF THE INVENTION

A tool for the removal of resist material from conductive boards such as circuit boards in areas covering and surrounding passages through the board.

A board supporting surface is provided with the surface having an aperture therethrough to allow a trimming tool to pass upwardly for removal of the resist material. Upward travel of this tool is precisely controlled to correspond to the thickness of the resist material on the side of the board being trimmed. Resist trimming operations are performed on one side of the board and the board thereafter turned over for removal of resist from the other side.

Surrounding the supporting surface aperture is a light source directed to shine upwardly through the aperture to pass through the resist material and the located passage.

Located above the support surface is a manual and electronic unit viewing section to receive the light which passes through a located board passage for positive location of such passage and centering of the passage in vertical alignment with the trimming tool located below the support surface. A clamp device is provided above the support surface which is engaged to the board following passage location. This clamp device eliminates any possible shifting of board during the resist trimming operation.

Vacuum cleaning means are also provided adjacent the cutting tool for removal of cut and trimmed resist material.

The provided structure makes provision for hole location, centering of the hole over a trimming and cutting tool, clamping the board in proper trimming position and limiting travel of the trimming tool to the thickness of the resist material to prevent any invasion of the conductive board.

BACKGROUND AND OBJECTS OF THE INVENTION

In the manufacture of conductive boards such as circuit boards it is well known in the art that various passages are initially provided through the board for various reasons. These passages may include registration openings and electrical component connection openings. After these openings are formed, both sides of the board are coated with photo resist material onto which the circuit board pattern will be photographed and the board and resist will be subjected to chemical milling operations. It is necessary to insure that the resist material is removed from the actual board passages and from an area circumscribing the passages.

In the past the removal of this resist material has been accomplished only through manual operations. To date, applicant is not aware of any mechanical devices that will accomplish proper location of the board passages and mechanical removal of the passage covering resist including a clearance area of the resist material surrounding the passage.

Applicant's device accomplishes all of these required functions.

It is therefore an object of the applicants' invention to provide a riston cutting machine which will afford proper location of passages in conductive boards such as circuit boards in position to a trim tool for operation of the tool to remove the resist that has been applied to the board.

It is a further object of the applicants' invention to provide a tool for the removal of resist material from areas surrounding passages in a conductive board such as a circuit board by providing a light source to pass through the resist material and the board passage to locate the passages and thereafter cut and trim the material from the passage area.

It is a further object of the applicants' invention to provide a tool for the removal of resist from areas surrounding passages through a conductive board such as a circuit board by providing a light source visible through the resist material and the board passage with visual inspection means to determine proper location of the circuit board passage over a cutting tool.

It is yet a further object of the applicants' invention to provide a riston cutting machine having light means for positive location of circuit board passages over a cutting tool with manual, visual and electronic monitoring means for inspection of the board passage location.

It is yet a further object of the applicants' invention to provide a riston cutting machine wherein a cutting and trimming tool is provided and controlled for limited cutting travel coordinated to the thickness of the resist material on such board such that the board is not invaded by the tool and only the applied resist is removed.

These and other objects and advantages of the applicants' invention will more fully appear from a consideration of the accompanying description and drawings.

DESCRIPTION OF A PREFERRED FORM OF THE INVENTION

Figure 1:
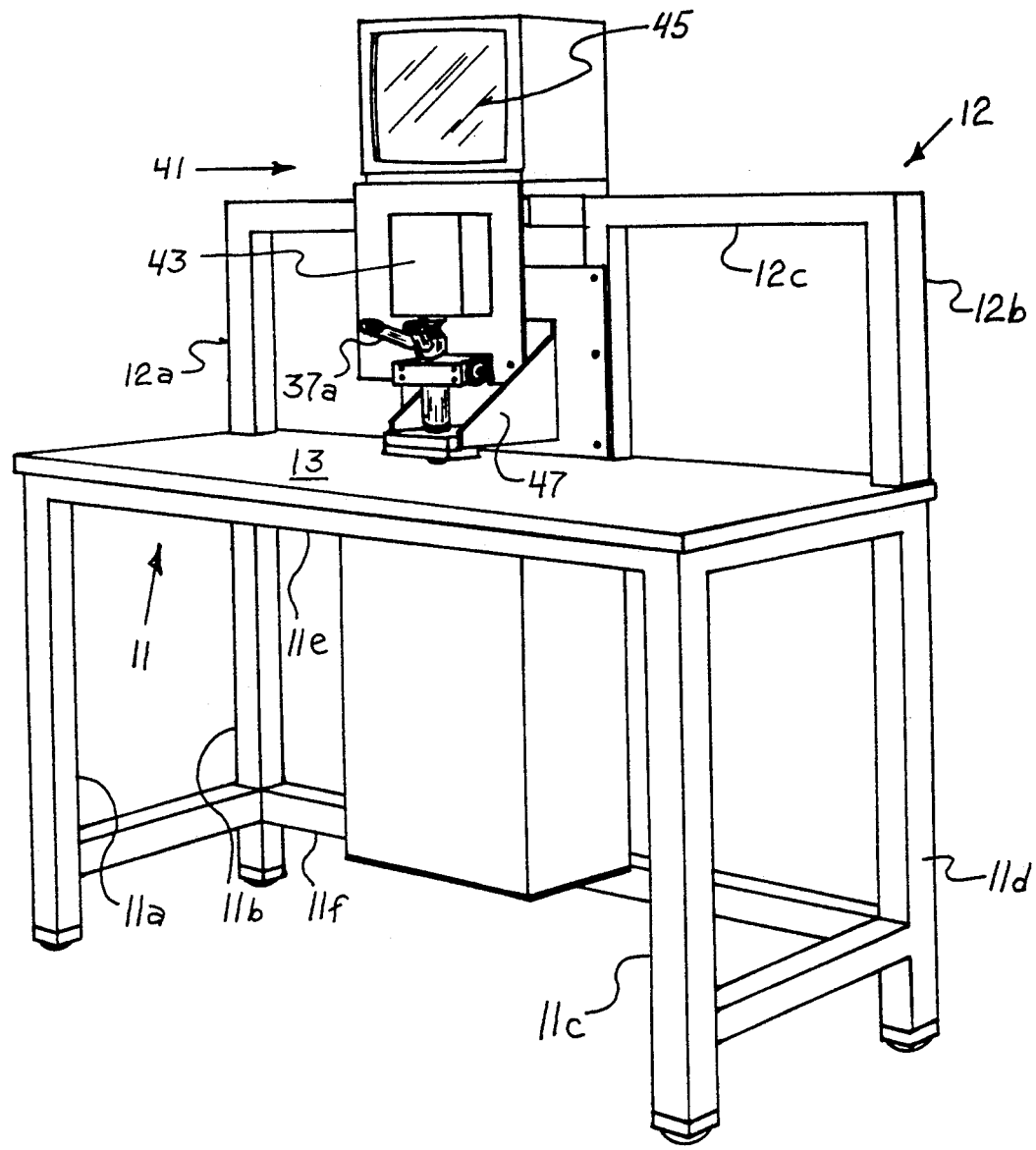
FIG. 1 is a perspective view of a riston cutting machine embodying the concepts of the applicants' invention.
Figure 2:
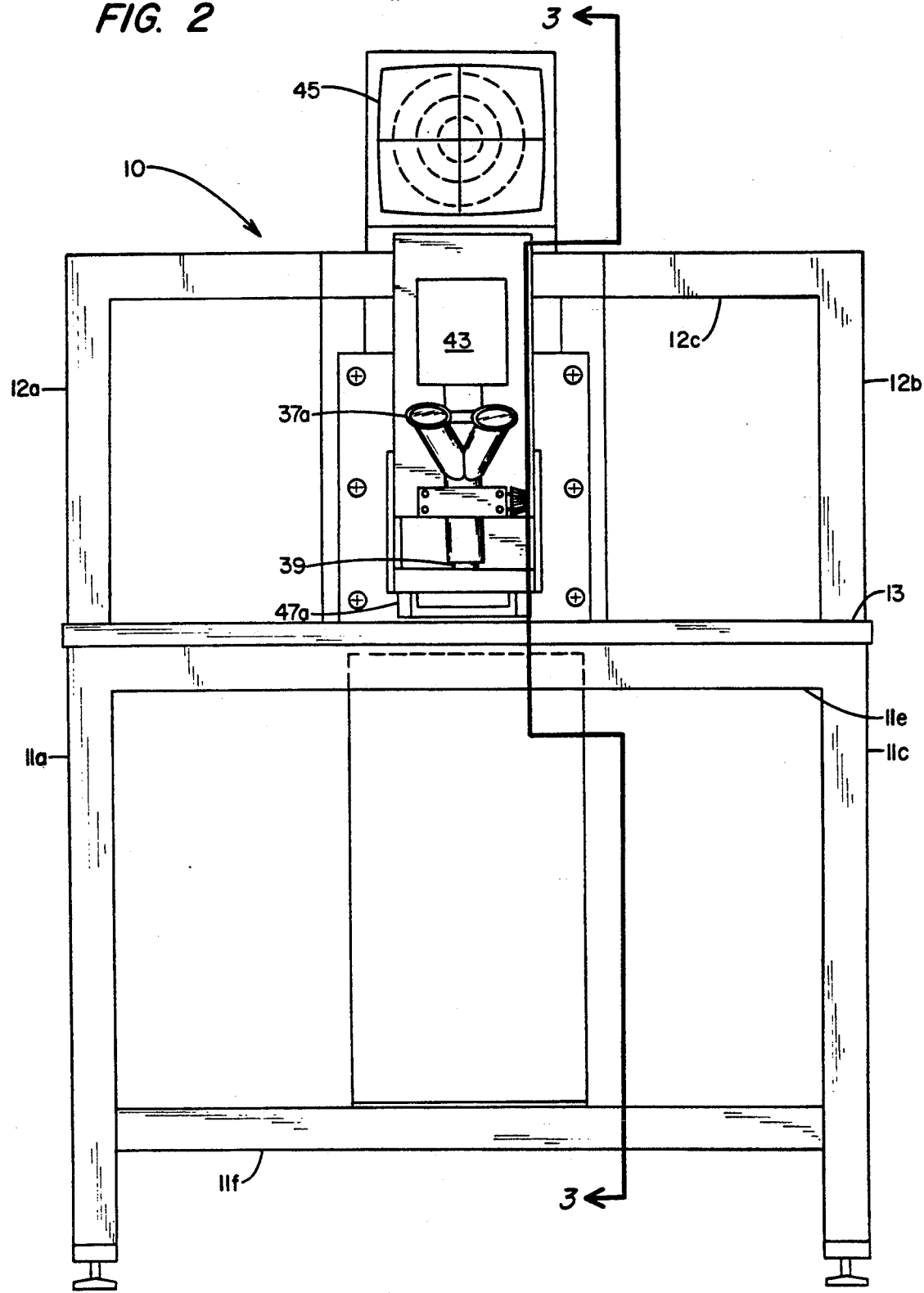
FIG. 2 is a front elevation of the resist trim tool as illustrated in FIG. 1.

In accordance with the accompanying drawings the riston cutting machine is generally designated 10. The unit includes a lower framework 11 having legs 11a, 11b, 11c, 11d and cross supports such as 11e, 11f. An upper framework is designated 12 and again includes vertical uprights 12a, 12b and at least one horizontal cross member 12c. The lower framework 11 provides a supporting structure for a board support surface 13 which, as illustrated, is arranged in horizontal relationship to provide a planar supporting surface for the carrying and placement of conductive boards which are to be resist trimmed.

Figure 3:
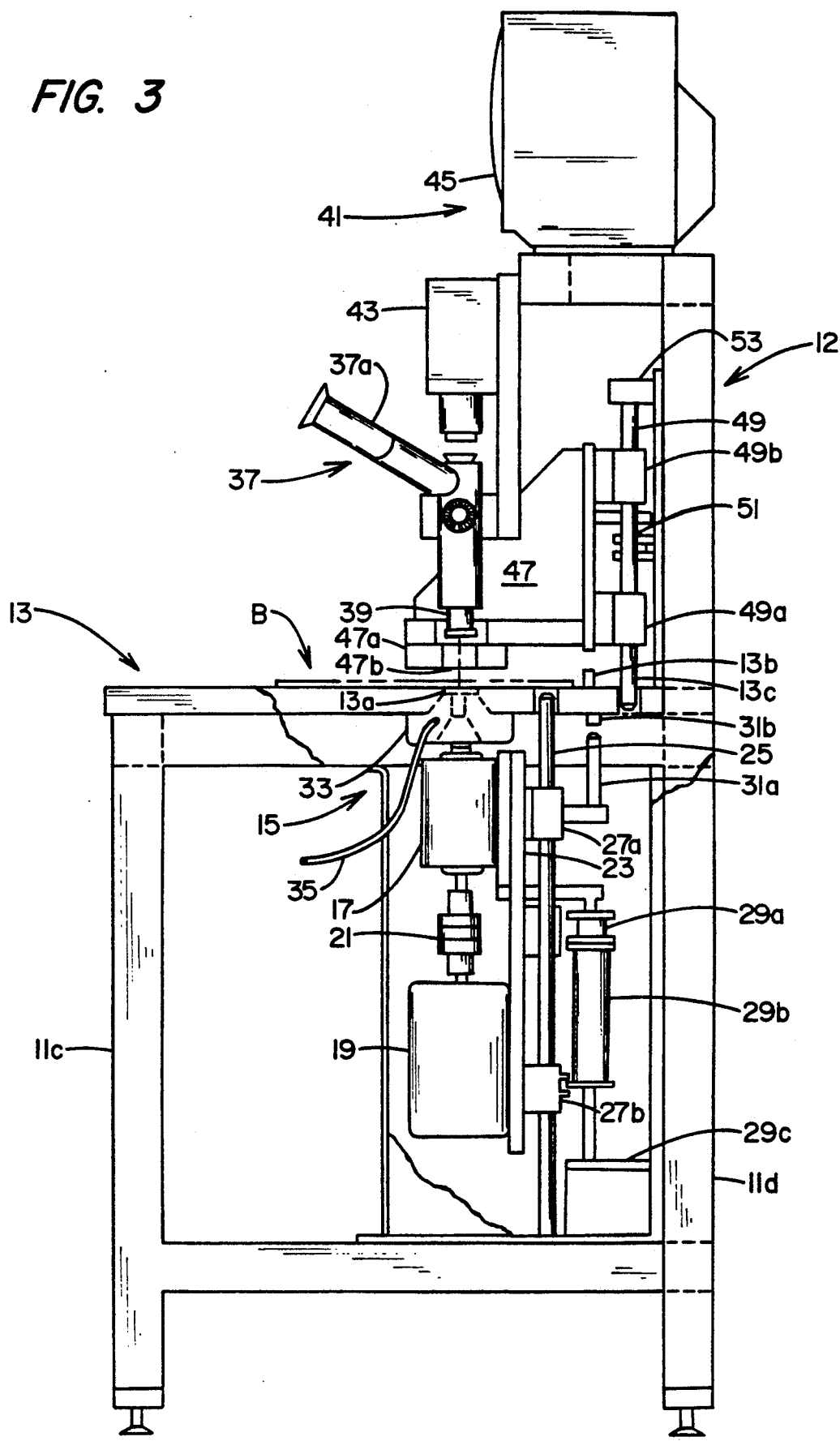
FIG. 3 is a vertical section taken substantially along line 3—3 of FIG. 2.

As best illustrated in FIG. 3, the lower framework structure 11 includes a vertically shiftable cutting and riston cutting machine arrangement 15 consisting of a cutting tool adaptor 17 and a drive motor 19 connected through a clutch device 21. This cutting tool arrangement 15 is mounted on framework 23 which framework 23 is arranged for vertical movement upon a positioning shaft 25 through at least a pair of bearings 27a, 27b. A drive mechanism for shifting the cutting tool assembly 15 is provided and connected to the mounting plate 23 and consists of, in the form shown, a first elevating section 29a and a second elevating section 29b both of which are attached to a frame portion 29c associated with frame 11. The aspect of a dual elevating mechanism 29a, 29b is to allow initial distance positioning of the cutting unit 15 at a predetermined distance from board B carried on surface 13 and allows a predetermined drive depth between a stop 31a carried by the first guide member 27a and a stop 31b on the under side of surface 13. The initial distance is determined and set by the thickness of the resist material on the board B.

Figure 5:
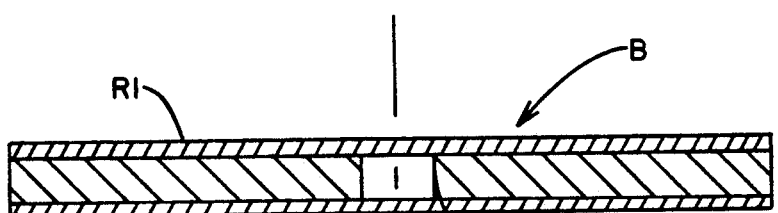
FIG. 5 illustrates a cross section of a typical curcuit board wherein resist material is illustrated covering both sides of the board.
Figure 6:
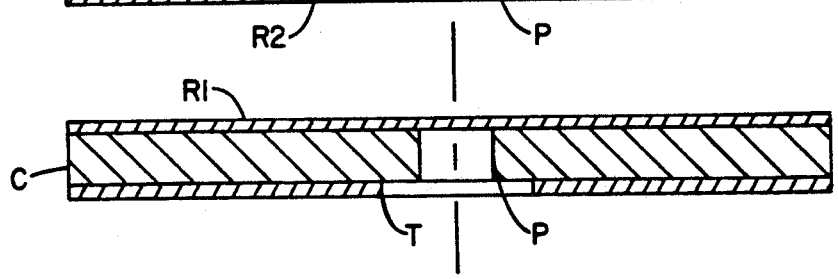
FIG. 6 is a view similar to FIG. 5 wherein the resist material has been removed from one surface of the board.

A typical board from which resist material is to be removed is illustrated in FIG. 5. As illustrated in FIG. 5, the conductive portion of the board B is designated C and the resist material on the respective sides thereof is designated R1, R2. As illustrated in FIGS. 5 and 6, this resist material may be of different thicknessses although it is standardly uniform in thickness on each respective side. FIG. 5 illustrates a board passage P with the resist material covering the passage in comparison to FIG. 6 which illustrates the board B with a trimmed area T. As illustrated, area T is of greater diameter than passage P and this view also illustrates that the tool that has provided the trimmed area has not penetrated the conductive portion C of the board B.

Figure 4:
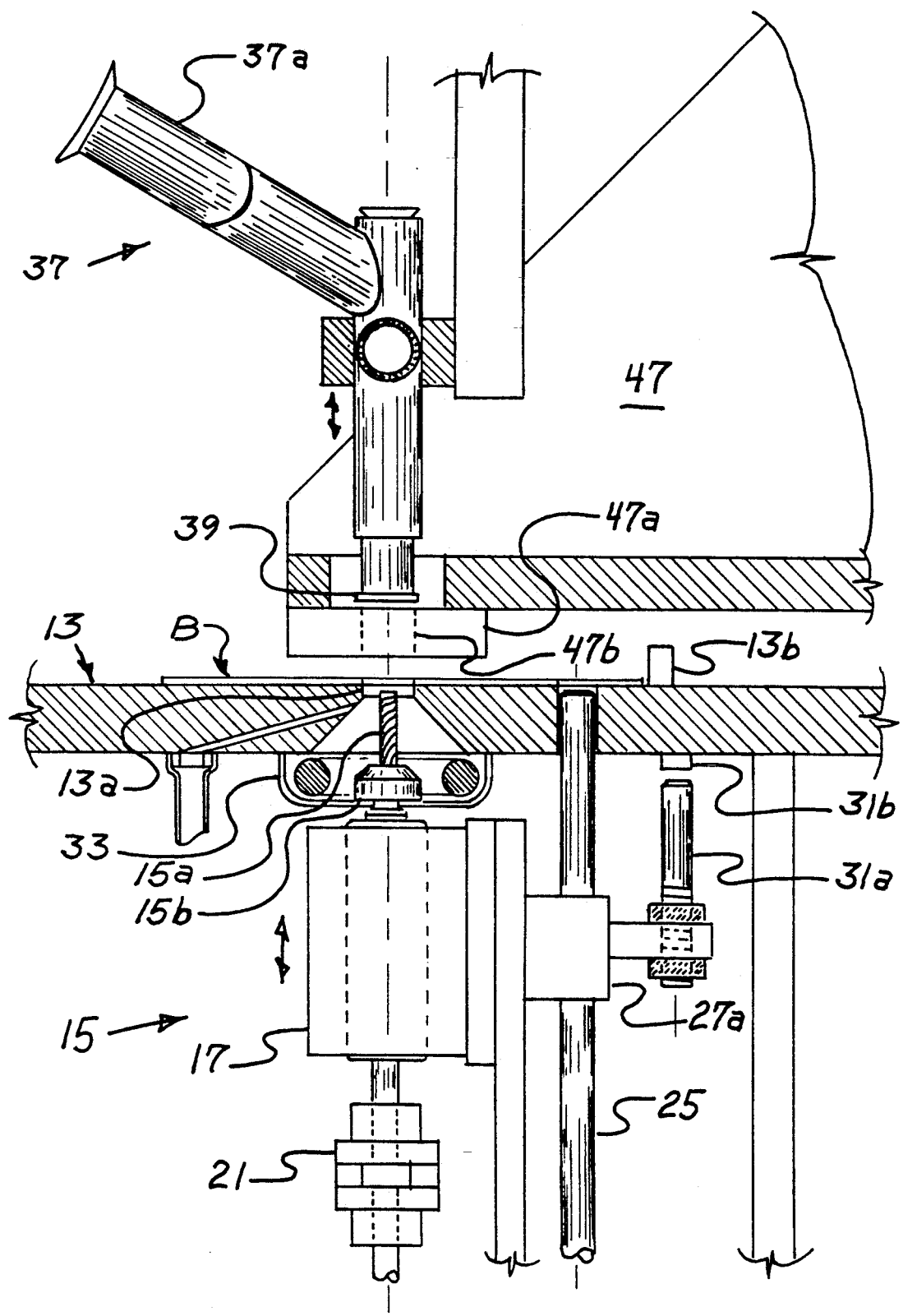
FIG. 4 is an enlarged view taken from a portion of FIG. 3 particularly illustrating the cutting, trimming tool, the board support surface, lighting arrangement, a manual viewing device and a board clamping device.

As particularly illustrated in FIG. 4 the cutter assembly 15 includes a cutting tool 15a which is selected in relationship to the passage P through board B. A chuck 15b is provided for interchangement of various sized cutting tools 15a. Elevating mechanism 29b not only allows for upward movement of cutter assembly 15 but also allows for complete lowering of the cutter assembly 15 for interchanging of cutting tools 15a.

As particularly illustrated in FIG. 4, an aperture 13a is provided through the support surface 13 to allow the cutting tool assembly 15 to be driven upwardly through the combined operation of the first 29a and second 29b elevating mechanisms for resist cutting and removal. Again, as particularly illustrated in FIG. 4 the stop devices 31a, 31b control the vertical movement of the cutter assembly 15 such that only photo resist material is cut from the board, again making reference to FIGS. 5 and 6.

As best illustrated in FIGS. 3 and 4 an illuminating device such as a ring light 33 is provided to circumscribe aperture 13a and this light 33 is shielded to direct light upwardly through aperture 13a.

As a board B is moved into position for trimming of the resist it should be obvious that light will not pass through the resist coated board except at those areas where a passage P exists in the board. As the board B is positioned and properly located over the aperture 13a of surface 13 light will pass through the resist material and through the passage P of the board to act as a locator of the passage P. Obviously the light will be directed concentrically with the cutting tool 15a and when the passage P is properly centered over aperture 13a the operator is insured that the cutting and trimming operation may be initiated.

As also illustrated in FIGS. 3 and 4, a vacuum may be directed adjacent cutting tool 15a through a vacuum line generally designated 35. Applicants have found that the resist material as cut by tool 15a must be removed to maintain proper operation of the cutting tool 15a and thus insure a properly defined trim area T in the resist.

Although the applicants illustrate two individual elements 17, 19 connected through clutch 21 for cutting and trimming operations, it should be obvious that this combination only provides a driving, rotating source for operation of the cutting tool 15a and this could be a single rotative source without departing from the scope of the invention. Applicants have also found that for preciseness of cut of the trim area T that the cutting unit should be relatively high speed and axial alignment is best afforded through a combination of the drive and driven elements 17, 19.

As particularly illustrated in FIG. 4, various stops such as 13b may be provided on the upper surface of support surface 13 for registration of identical boards B having identically located passages P such that each board will not require an individual viewing to determine proper alignment of board passages P with the cutting tool 15a. The settable stops 13b provide for reset placement of boards B once a pattern has been established.

The upper assembly of the unit including the framework 12 combines two individual means for determining proper location of the cutting areas of the board B with respect to the cutting tool 15a. A first of these means is designated 37 and includes manual, visual lens means 39 which is vertically adjustable for specifically locating the emitted light with regard to a target passage area.

The second of such viewing means is generally designated 41 and includes an electronic camera 43 and monitor 45. Camera 43 and the monitor 45 are electronically connected and, as illustrated in FIG. 3 the camera is aligned with the first viewing system 37 such that either manual, visual inspection may be made through an eye piece 37a or electronic viewing as provided by the camera 43 and monitor 45.

Figure 7:
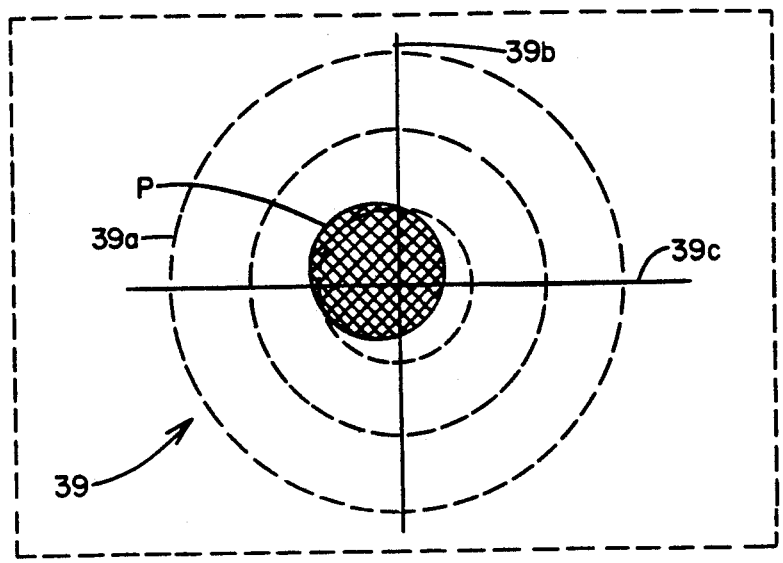
FIG. 7 is a view that would appear for visual, manual viewing and also upon the electronic monitor screen particularly illustrating a board passage in non-centered position; and, FIG. 8 is a view similar to FIG. 7 illustrating the view with a board passage in centered position.
Figure 8:
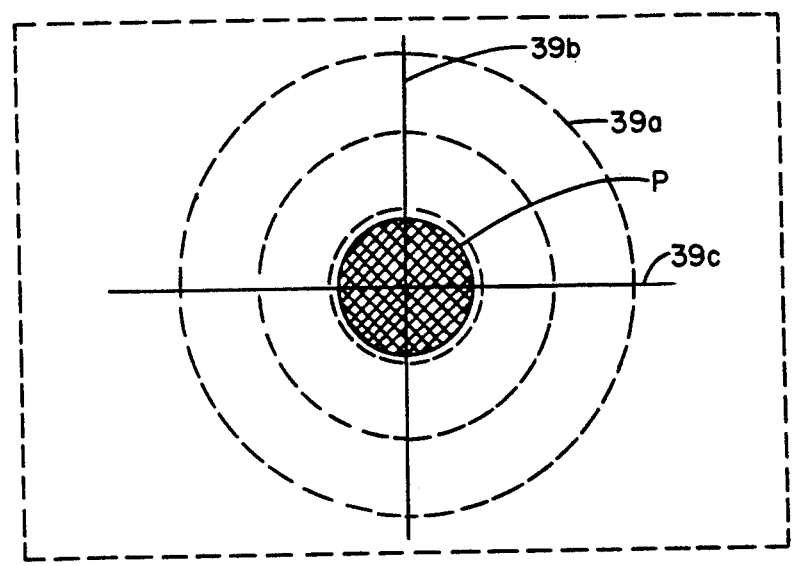

The results of either viewing technique are illustrated in FIGS. 7 and 8. The target section 39 may, as illustrated, include a plurality of concentric rings 39a with a cross hair configuration 39b, 39c. This configuration will allow the operator to move and adjust the position of the board B such that the passage P of the board, which is light passing is precisely centered and this precise centering will be in alignment with the cutting tool 15a.

As also best illustrated in FIG. 3, a clamp unit 47 is provided on the upper framework 12 and is guided for vertical movement on stationary shaft 49. Shaft 49 is illustrated as being mounted in mounting block 53 and passage 13c in plate 13. Clamp 47 is driven on shaft 49 driven through a drive mechanism 51. Various drive methods for shifting of clamp 47 are available and, for example, shaft 49 may be in the form of a ball screw with drive mechanism 51 providing rotative power to the ball screw shaft 49 with ball housings 49a, 49b moving the clamp 47 upon rotation of shaft 49.

Clamp unit 47, in the form shown, includes a lower clamping plate 47a having an aperture 47b therethrough which allows for light passage through surface aperture 13a, the located board B and into the viewing systems 37, 41. After a board B is properly located, preferably into the position as illustrated in FIG. 8 the entire clamping unit 47 is driven downwardly to clamp the board B onto the support surface 13. This clamping arrangement prevents possible chattering of the board B during the trimming operation as aaccomplished through cutting tool 15a.

It should be obvious that the vacuum line 35 could also be utilized to hold the board B positively against the support 13 to prevent chattering or possible movement of the board B after the lighting alignment has been accomplished.

As illustrated in FIGS. 5 and 6 the resist material R1, R2 is applied to both sides of the conductive member C. The resist material thicknesses may vary and it should be obvious that the setting of movement for the cutter assembly 15 must be modified to insure that only the resist material is removed and there is no invasion of the conductive member C.

Obviously, in use, accomodation is made for changing of the cutting tools 15a for trimming of the resist material overlying any passage and an area surrounding such passage or passages. This is accomplished without invasion of the conductive board to maintain the integrity of the board. The aspect of board passage location is of prime import to the invention and the method of accomplishing such location is dependent only upon true location of the passage rather than through mechanical measuring techniques.

What I claim is:

1. A riston cutting machine for removing only riston material from conductive boards such as circuit boards which boards are normally provided with pre-drilled passages therethrough and are overlaid with riston material on at least one side of the board which riston material covers the passages, such tool including:
    a. a framework providing a substantially flat, horizontal surface for supporting a board;
    b. said flat surface providing an aperture therethrough;
    c. a rotatably driven cutting tool and mechanism for driving the same mounted on said framework in vertical alignment with said surface aperture;
    d. a light source mounted in relation to said surface aperture to direct light through said aperture and directed to illuminate the board from which the riston material is to be removed, the light from said source passing through said riston and said board passage;
    e. light receiving means arranged above the board to receive light from said source that passes through the riston material and the passage through the board;
    f. said light receiving means being arranged in alignment with said cutting tool such that light received thereby establishes alignment of the board passage with said cutting tool;
    g. means for bringing said cutting tool into contact with the riston on the board for removal thereof; and,
    h. means for controlling movement of said tool to limit the movement thereof to the thickness of the riston to prevent cutting of the conductive material of the board.

2. The riston cutting machine as set forth in claim 1 and said driven cutting tool and mechanism for driving, and said light source are positioned below said support surface and said light receiving means is positioned above said support surface.

3. The riston cutting machine as set forth in claim 1 and said light source including a light ring surrounding said surface aperture.

4. The riston cutting machine as set forth in claim 1 and said rotatably driven cutting tool and mechanism includes means for providing cutting tools of various diameters.

5. The riston cutting machine as set forth in claim 1 and said light receiving means including means for manually, visually inspecting the light passing through the board and the riston surface to determine alignment therof with relation to said cutting tool.

6. The riston cutting machine as set forth in claim 5 and said light receiving means including a shiftable lens structure for focusing the received light as passing through the board and the riston surface.

7. The riston cutting machine as set forth in claim 6 and said light receiving means including a taget area whereby light passing through said board passage is visually comparable to said cutting tool for alignment thereof.

8. The riston cutting machine as set forth in claim 1 and said light receiving means including:
    a. a camera arranged to receive transmitted light;
    b. a monitor; and,
    c. said camera and said monitor being electronically connected whereby the image received by said camera is electronically transmitted to said monitor for viewing thereof.

9. The riston cutting machine as set forth in claim 8 and said monitor including a target area whereby light passing through said board passage is visually comparable to said cutting tool for alignment thereof.

10. The riston cutting machine as set forth in claim 4 wherein said cutting tools are selected in diameters greater than the board passages to provide a removed diameter of riston material greater than the diameter of the passages.

* * * * *